(12) United States Patent
Tezuka

(10) Patent No.: US 11,183,999 B2
(45) Date of Patent: Nov. 23, 2021

(54) CONTROL CIRCUIT AND SEMICONDUCTOR DEVICE

(71) Applicant: FUJI ELECTRIC CO., LTD., Kawasaki (JP)

(72) Inventor: Shinichi Tezuka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/028,509

(22) Filed: Sep. 22, 2020

(65) Prior Publication Data
US 2021/0152168 A1 May 20, 2021

(30) Foreign Application Priority Data
Nov. 18, 2019 (JP) .............................. JP2019-207719

(51) Int. Cl.
*H03K 17/00* (2006.01)
*H03K 17/0412* (2006.01)
*H03K 17/042* (2006.01)
*H03K 17/0812* (2006.01)
*H03K 17/08* (2006.01)

(52) U.S. Cl.
CPC . *H03K 17/04123* (2013.01); *H03K 17/04206* (2013.01); *H03K 17/08122* (2013.01); *H03K 2017/0806* (2013.01)

(58) Field of Classification Search
CPC ....... H03K 17/04123; H03K 17/08122; H03K 17/04206; H03K 2017/0806
USPC ......................................................... 327/365
See application file for complete search history.

(56) References Cited

U.S. PATENT DOCUMENTS

2015/0364913 A1* 12/2015 Minoya ................. H02H 9/025
                                                                 361/93.9
2020/0021282 A1* 1/2020 Yamamoto ......... H03K 17/0826

FOREIGN PATENT DOCUMENTS

| JP | 2013-062730 A | 4/2013 |
|----|---------------|--------|
| JP | 2016-208633 A | 12/2016 |
| JP | 2017-046570 A | 3/2017 |

\* cited by examiner

*Primary Examiner* — Metasebia T Retebo
(74) *Attorney, Agent, or Firm* — Rabin & Berdo, P.C.

(57) ABSTRACT

A control circuit controlling to drive a switching device includes a first detection circuit that detects whether a power supply voltage received by a drive circuit that drives the switching device drops below a first level, a second detection circuit that receives a current flowing through the switching device and detects whether the current exceeds a first value, and an abnormality detection circuit that causes the drive circuit to turn off the switching device, based on whether a condition that the power supply voltage is lower than the first level and the current flowing through the switching device is larger than the first value is satisfied.

14 Claims, 10 Drawing Sheets

CONTROL CIRCUIT AND SEMICONDUCTOR DEVICE

CROSS-REFERENCE TO RELATED APPLICATION

The present application claims priority pursuant to 35 U.S.C. § 119 from Japanese patent application number 2019-207719 filed on Nov. 18, 2019, the entire disclosure of which is hereby incorporated by reference herein.

BACKGROUND

Technical Field

The present disclosure relates to a control circuit and a semiconductor device.

Description of the Related Art

There are known drive circuits for driving switching devices (for example, Japanese Patent Application Publication No. 2016-208633).

In a case where a drive circuit drives a switching device, when the voltage for turning on the switching device drops with a drop in the power supply voltage of the drive circuit, the on-voltage of the switching device rises. Then, such a rise in the on-voltage and an increase in the current flowing through the switching device could break the switching device with heat.

The present disclosure has been achieved in light of an issue as described above, and an object thereof is to provide a technique capable of preventing a switching device from being broken by heat.

SUMMARY

An aspect of a control circuit according to the present disclosure for solving an issue described above which controls to drive a switching device comprises: a drive circuit receiving a power supply voltage; a first detection circuit that detects whether the power supply voltage received by the drive circuit drops below a first level; a second detection circuit that receives a current flowing through the switching device and detects whether the current exceeds a first value; and an abnormality detection circuit that causes the drive circuit to turn off the switching device responsive to detecting that a condition is satisfied, the condition being that both the power supply voltage is lower than the first level and the current flowing through the switching device is larger than the first value.

An aspect of a semiconductor device according to the present disclosure for solving an issue described above comprises: a switching device; a drive circuit that receives a power supply voltage and that drives the switching device; a first detection circuit that detects whether the power supply voltage received by the drive circuit drops below a first level; a second detection circuit that is connected to the switching device, and that detects whether a current flowing through the switching device exceeds a first value; and an abnormality detection circuit that causes the drive circuit to turn off the switching device upon detecting that a condition is satisfied, the condition being that the power supply voltage is lower than the first level and the current flowing through the switching device is larger than the first value.

The present disclosure is able to provide a technique capable of preventing a switching device from being broken by heat.

DETAILED DESCRIPTION

At least the following details will become apparent from descriptions of the present specification and of the accompanying drawings.

Embodiment of the Present Disclosure

<<<Three-Phase Inverter 12>>>

Figure 1:
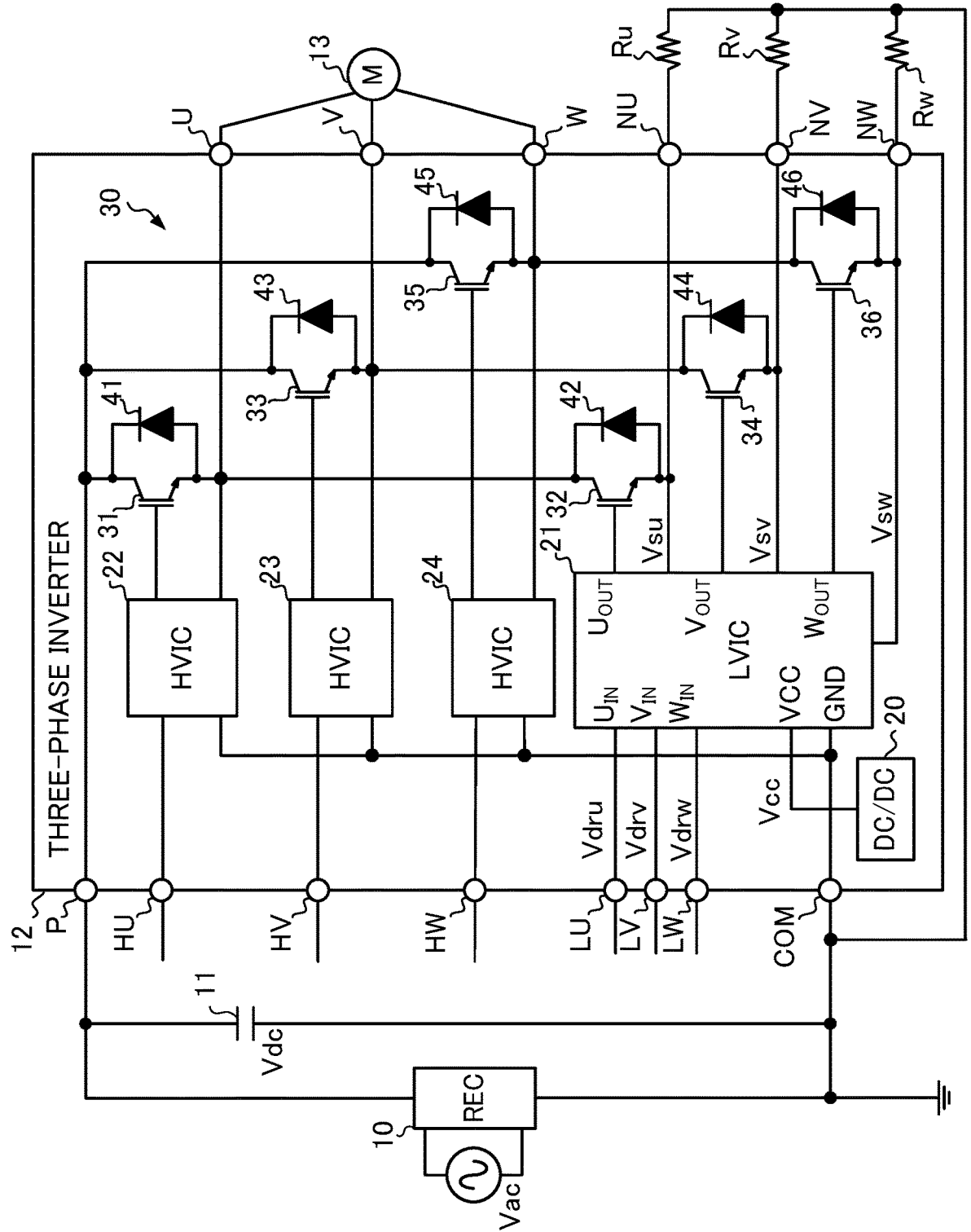
FIG. 1 is a diagram illustrating an example of a three-phase inverter 12.

FIG. 1 is a diagram illustrating an example of a configuration of a three-phase inverter 12 that receives an alternating-current voltage (AC voltage) Vac and drives a three-phase motor 13.

A full-wave rectifier circuit 10 full-wave rectifies the applied predetermined AC voltage Vac and outputs the resultant to a capacitor 11. The AC voltage Vac is, for example, a voltage of 100 to 240 V having a frequency of 50 to 60 Hz.

The capacitor 11 smooths the voltage rectified by the full-wave rectifier circuit 10 and outputs a direct-current voltage (DC voltage) Vdc of 400 V, for example.

The three-phase inverter 12 is a semiconductor device that converts the DC voltage Vdc applied between a terminal P and a terminal COM into a predetermined AC voltage, to drive the three-phase motor 13. The three-phase inverter 12 includes a DC/DC converter 20, a low-side drive circuit 21, high-side drive circuits 22 to 24, a bridge circuit 30 for electric power conversion, and terminals HU, HV, HW, LU, LV, LW, P, U, V, W, NU, NV, and NW.

The DC/DC converter 20 is a circuit that steps down the DC voltage Vdc to a predetermined level of a power supply voltage Vcc.

The low-side drive circuit 21 is an integrated circuit for switching IGBTs 32, 34, and 36 of the bridge circuit 30 (described later) on the lower arm side, using drive signals Vdru, Vdrv, and Vdrw from a microcomputer (not illustrated) input via the terminals LU, LV, and LW.

The high-side drive circuits 22 to 24 are integrated circuits for respectively switching IGBTs 31, 33, and 35 of the bridge circuit 30 (described later) on the upper arm side, using signals from the microcomputer (not illustrated) input via terminals HU, HV, and HW.

The bridge circuit 30 includes insulated gate bipolar transistors (IGBTs) 31 to 36 and free wheeling diodes (FWDs) 41 to 46.

The IGBTs 31 and 32 are U-phase switching devices, and are provided with the FWDs 41 and 42, respectively. The IGBTs 33 and 34 are V-phase switching devices, and are provided with the FWDs 43 and 44, respectively. The IGBTs 35 and 36 are W-phase switching devices, and are provided with the FWDs 45 and 46, respectively. Resistors Ru, Rv, and Rw are provided to detect the currents flowing through the IGBTs 32, 34, and 36.

The voltages generated across the resistors Ru, Rv, and Rw are respectively referred to as "voltage Vsu", "voltage Vsv", and "voltage Vsw". The terminals U, V, and W are coupled to the three-phase motor 13 which is a load, and the terminals NU, NV, and NW are grounded via the resistors Ru, Rv, and Rw, respectively.

<<<Low-Side Drive Circuit 21>>>

Figure 2:
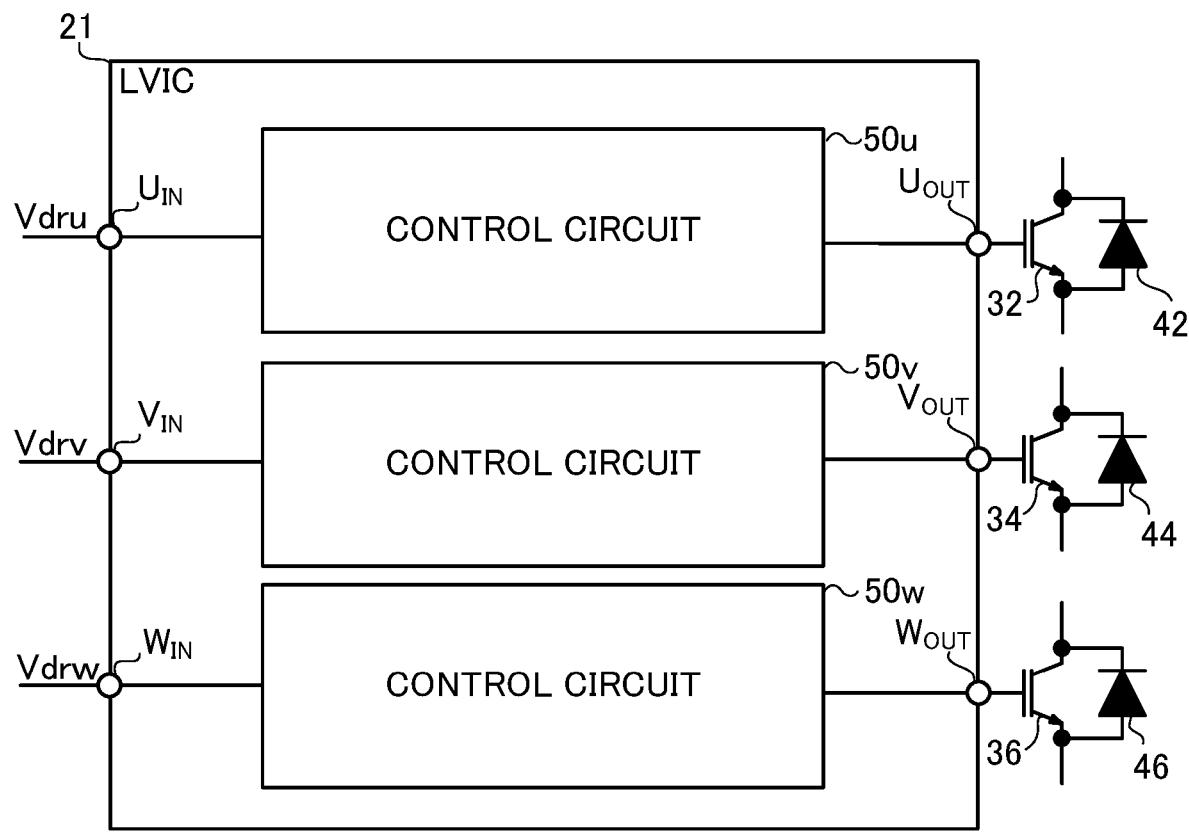
FIG. 2 is a diagram illustrating an example of a low-side drive circuit 21.

FIG. 2 is a diagram illustrating an example of the configuration of the low-side drive circuit 21. The low-side drive circuit 21 includes a control circuit 50*u* that drives the IGBT 32 which is a U-phase IGBT, a control circuit 50*v* that drives the IGBT 34 which is a V-phase IGBT, and a control circuit 50*w* that drives the IGBT 36 which is a W-phase IGBT. The control circuits 50*u*, 50*v*, and 50*w* are similar to one another, and hence, hereinafter, the control circuit 50*u* will be mainly described.

<<Control Circuit 50*u*>>

Figure 3:
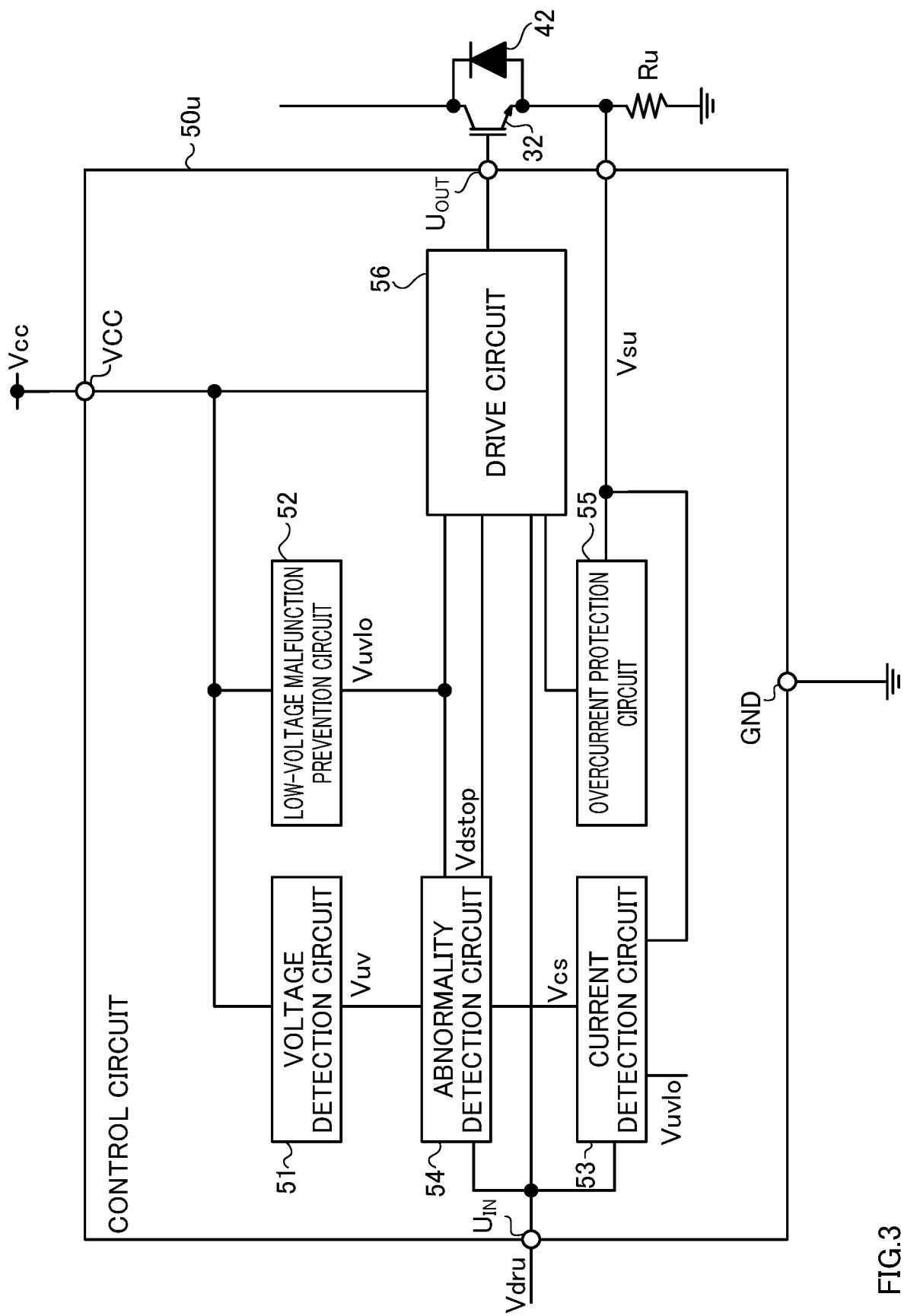
FIG. 3 is a diagram illustrating an example of a control circuit 50u.

FIG. 3 is a diagram illustrating an example of the configuration of the control circuit 50*u*. The control circuit 50*u* is a circuit that turns on the IGBT 32 when the drive signal Vdru from the microcomputer (not illustrated) is high, and turns off the IGBT 32 when the drive signal Vdru is low. Although the details will be described later, the control circuit 50*u* can also be a protection circuit that turns off the IGBT 32 to protect the IGBT 32 from heat and overcurrent, while preventing a malfunction of switching of the IGBT 32 caused by a drop in the power supply voltage Vcc.

The control circuit 50*u* includes a voltage detection circuit 51, a low-voltage malfunction prevention circuit 52, a current detection circuit 53, an abnormality detection circuit 54, an overcurrent protection circuit 55, and a drive circuit 56.

<<Voltage Detection Circuit 51>>

Figure 4:
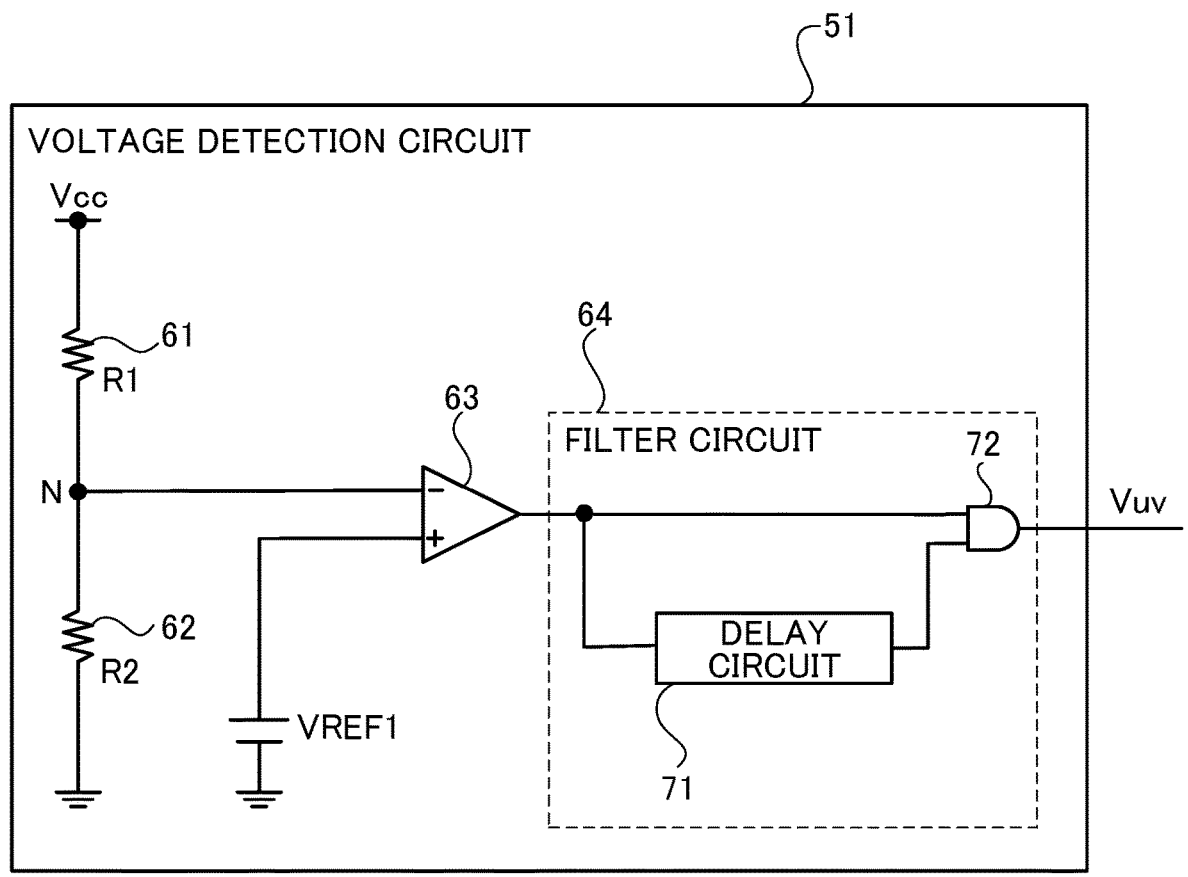
FIG. 4 is a diagram illustrating an example of a voltage detection circuit 51.

FIG. 4 is a diagram illustrating an example of the voltage detection circuit 51. The voltage detection circuit 51 is a circuit that detects whether the power supply voltage Vcc of the drive circuit 56 for driving the IGBT 32 has dropped below the lower limit voltage Vlow of the recommended operating range. Although the details will be described later, when the level of the power supply voltage Vcc is within the recommended operating range, the drive circuit 56 can make the on-voltage of the IGBT 32 small enough.

The voltage detection circuit 51 includes resistors 61 and 62, a comparator 63, and a filter circuit 64.

The resistors 61 and 62 are coupled in series and configure a voltage divider circuit that divides the power supply voltage Vcc. In an embodiment of the present disclosure, the coupling point of the resistors 61 and 62 is referred to as a node N, and a voltage VN at the node N can be obtained as follows.

$$VN = Vcc \times R2/(R1+R2) \qquad \text{Expression (1)}$$

The comparator 63 has an inverting input terminal to which the voltage VN is applied and a non-inverting input terminal to which a reference voltage VREF1 is applied. Here, the reference voltage VREF1 is a voltage corresponding to the lower limit voltage Vlow of the recommended operating range of the power supply voltage Vcc.

Thus, when the voltage VN drops below the reference voltage VREF1, the comparator 63 detects that the power supply voltage Vcc is lower than the lower limit voltage Vlow and outputs a high level (hereinafter referred to as "high level" or "high"). When the voltage VN becomes higher than the reference voltage VREF1, the comparator 63 detects that the power supply voltage Vcc is higher than the lower limit voltage Vlow and outputs a low level (hereinafter referred to as "low level" or "low").

In order to detect whether the power supply voltage Vcc has become equal to the lower limit voltage Vlow of the recommended operating range, the reference voltage VREF1 is determined using the lower limit voltage Vlow and Expression 1 as follows.

$$VREF1 = Vlow \times R2/(R1+R2) \qquad \text{Expression (2)}$$

Here, the lower limit voltage Vlow corresponds to a "first level".

The filter circuit 64 is a circuit for masking the output of the comparator 63 when the power supply voltage Vcc fluctuates and momentarily drops below the lower limit voltage Vlow. Note that hereinafter the term "momentarily" means a short time, for example, about 10 µs. The filter circuit 64 includes a delay circuit 71 and an AND element 72.

The delay circuit 71 delays the output of the comparator 63, for example, by 10 µs. The AND element 72 performs a logical product of the output of the delay circuit 71 and the output of the comparator 63, and outputs a signal Vuv. As a result, only when the power supply voltage Vcc is lower than the lower limit voltage Vlow for a time period longer than 10 µs, the filter circuit 64 sets the signal Vuv to the high level.

Although FIG. 4 illustrates an example in which the filter circuit 64 is coupled to the output of the comparator 63, the filter circuit 64 may be coupled between the node N and the inverting input terminal of the comparator 63. Note that the voltage detection circuit 51 corresponds to a "first detection circuit".

<<Low-Voltage Malfunction Prevention Circuit 52>>

The low-voltage malfunction prevention circuit 52 is a circuit that detects whether the power supply voltage Vcc has dropped below a "trip voltage V2", in order to prevent a malfunction in the case where the power supply voltage Vcc drops. The low-voltage malfunction prevention circuit 52 has hysteresis characteristics and compares a reset voltage V1, which is a higher threshold voltage, to the power supply voltage Vcc, and also compares the "trip voltage V2", which is a lower threshold voltage, to the power supply voltage Vcc, in operating the control circuit 50*u*.

When the power supply voltage Vcc drops below the "trip voltage V2", the low-voltage malfunction prevention circuit 52 sets a signal Vuvlo indicative of the comparison result to the high level. Further, the power supply voltage Vcc drops below the "trip voltage V2", and thereafter, when the power supply voltage Vcc rises above the "reset voltage V1", the low-voltage malfunction prevention circuit 52 sets the signal Vuvlo to the low level.

Note that, in an embodiment of the present disclosure, the foregoing lower limit voltage Vlow of the recommended operating range is higher than the "reset voltage V1" and the "trip voltage V2".

<<Current Detection Circuit 53>>

Figure 5:
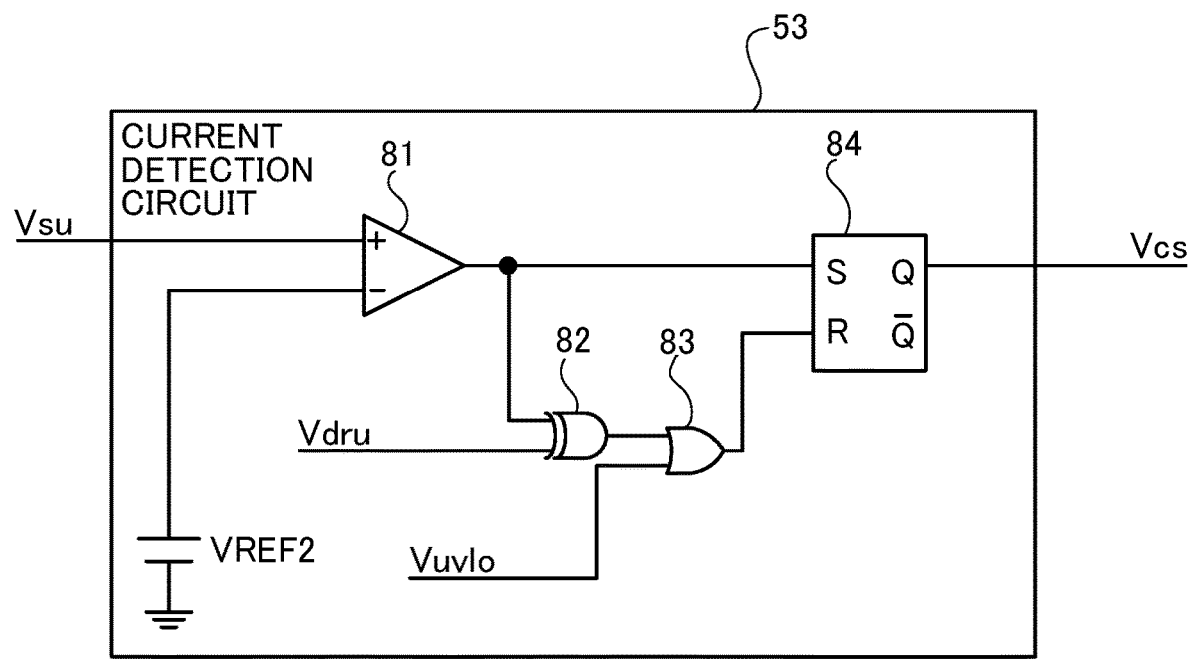
FIG. 5 is a diagram illustrating an example of a current detection circuit 53.

FIG. 5 is a diagram illustrating an example of the current detection circuit 53. The current detection circuit 53 is a circuit that detects whether the current flowing through the IGBT 32 is larger than a predetermined current value Ic, based on the voltage Vsu corresponding to the current flowing through the IGBT 32 and a reference voltage VREF2 corresponding to the current value Ic. Note that the current value Ic is a value smaller than overcurrent (described later) and the value for detecting whether the IGBT 32 whose on-voltage has risen would be broken by heat.

Further, in an embodiment of the present disclosure, when the current of the current value Ic flows through the resistor Ru, and the voltage Vsu is equal to the reference voltage VREF2, the following expression holds.

$$VREF2 = Vsu = Ic \times Ru \qquad \text{Expression (3)}$$

The current detection circuit 53 includes a comparator 81, an EXOR element 82, an OR element 83, and an SR flip-flop 84.

The comparator 81 is a circuit for detecting whether the current value of the current flowing through the IGBT 32 has exceeded the current value Ic. The comparator 81 has a non-inverting input terminal to which the voltage Vsu changing according to the current flowing through the resistor Ru is applied and an inverting input terminal to which the reference voltage VREF2 is applied.

When the current value of the current flowing through the IGBT 32 becomes larger than the current value Ic, and the voltage Vsu exceeds the reference voltage VREF2, the comparator 81 outputs a high signal. Then, when the comparator 81 outputs the high signal, the Q output of the SR flip-flop 84 is set to the high level.

Either when a current is not flowing through the IGBT 32 or when the current value of the current flowing through the IGBT 32 is smaller than the current value Ic, the voltage Vsu drops below the reference voltage VREF2. In this case, the comparator 81 outputs a low signal.

The EXOR element 82 is a circuit that, when the drive signal Vdru is at the high level for turning on the IGBT 32, and the current value of the current flowing through the IGBT 32 is smaller the current value Ic, generates a signal for resetting the Q output of the SR flip-flop 84.

Here, when the drive signal Vdru is high, and the output of the comparator 81 is high, the EXOR element 82 outputs a low signal. When the drive signal Vdru is high, and the output of the comparator 81 is low, the EXOR element 82 outputs a high signal. Although the details will be described later, when the EXOR element 82 outputs the high signal, the SR flip-flop 84 resets the Q output.

Note that when the drive signal Vdru is at the low level for turning off the IGBT 32, a current does not flow through the IGBT 32, and hence, the comparator 81 outputs a low signal. Thus, the EXOR element 82 outputs a low signal.

The OR element 83 is a circuit that, when the drive signal Vdru is high, and the current value of the IGBT 32 is smaller than the current value Ic or the power supply voltage Vcc drops below the "trip voltage V2", generates a signal for resetting the Q output of the SR flip-flop 84.

Hereinafter, the case where the drive signal Vdru is high, and the current value of the IGBT 32 is smaller than the current value Ic or the power supply voltage Vcc drops below the "trip voltage V2" is defined as the case where a condition 1 is satisfied.

When the condition 1 is satisfied, the output of the EXOR element 82 or the signal Vuvlo is high. Thus, the OR element 83 outputs a high signal. In contrast, when the condition 1 is not satisfied, the output of the EXOR element 82 and the signal Vuvlo are low. Thus, the OR element 83 outputs a low signal. As a result, when the condition 1 is satisfied, the Q output of the SR flip-flop 84 is reset to the low level.

Accordingly, when the current value of the current flowing through the IGBT 32 exceeds the current value Ic, the current detection circuit 53 sets a signal Vcs to the high level. In contrast, when the current value of the current flowing through the IGBT 32 becomes smaller than the current value Ic, or the power supply voltage Vcc becomes lower than the "trip voltage V2", the current detection circuit 53 sets the signal Vcs to the low level.

Consequently, the current detection circuit 53 outputs the signal Vcs indicative of whether the current value of the current flowing through the IGBT 32 is larger than the current value Ic, to the abnormality detection circuit 54 (described later).

Note that the current value Ic corresponds to a "first value", and the trip voltage for activating the low-voltage malfunction prevention circuit 52 corresponds to a "second level".

In addition, the current detection circuit 53 corresponds to a "second detection circuit", and the high signal Vcs indicative that the current value of the current flowing through the IGBT 32 is larger than the current value Ic corresponds to a "second signal".

<<Abnormality Detection Circuit 54>>

Figure 6:
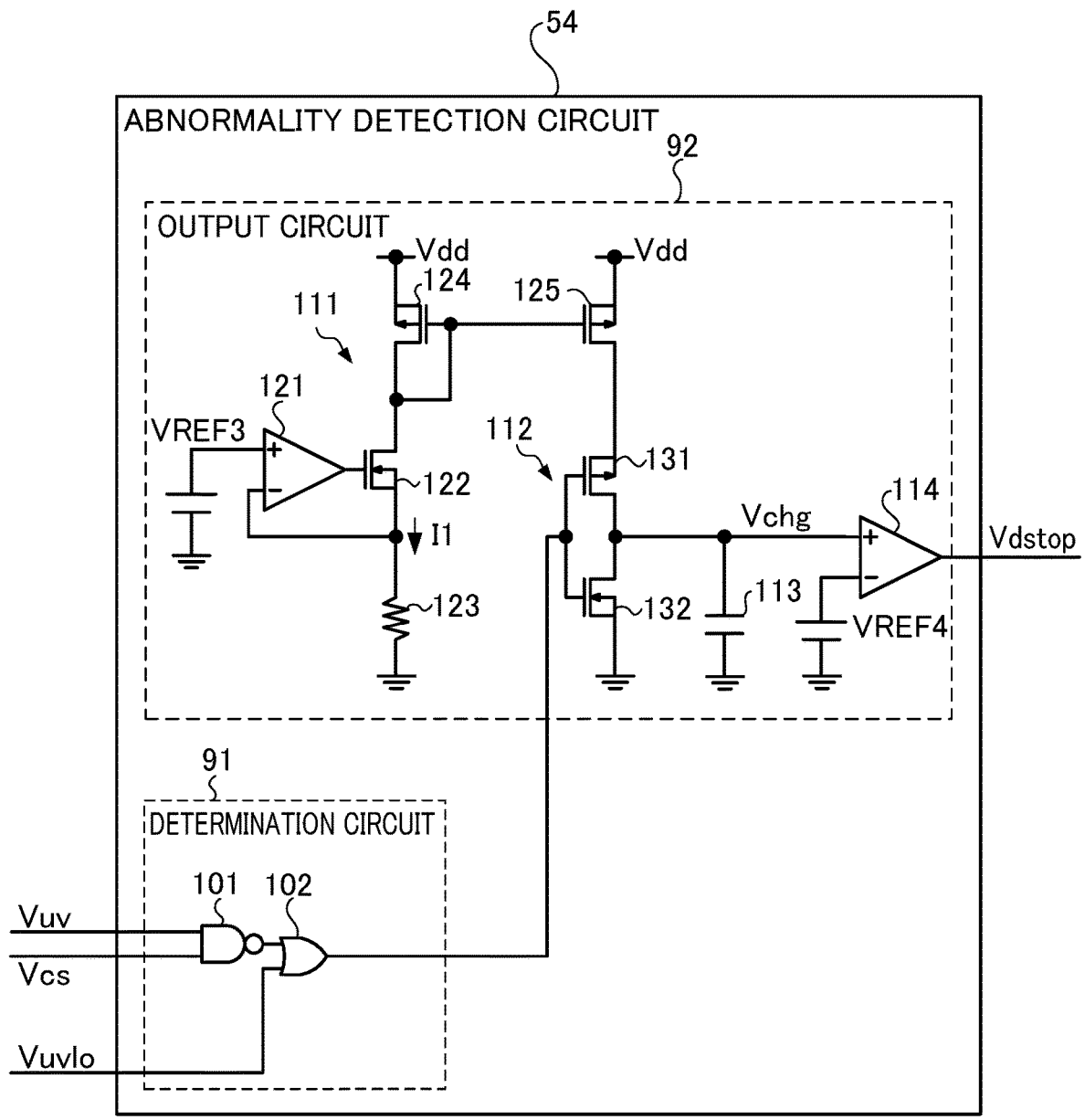
FIG. 6 is a diagram illustrating an example of an abnormality detection circuit 54.

FIG. 6 is a diagram illustrating an example of the abnormality detection circuit 54. The abnormality detection circuit 54 is a circuit that causes the drive circuit 56 to turn off the IGBT 32, in the case where a condition that when the power supply voltage Vcc of the drive circuit 56 is lower than the lower limit voltage Vlow and higher than the "trip voltage V2", the current flowing through the IGBT 32 is larger than current value Ic (hereinafter referred to as a condition 2) is satisfied for a predetermined time T1.

The abnormality detection circuit 54 includes a determination circuit 91 and an output circuit 92. The determination circuit 91 is a circuit that determines whether the condition 2 has been satisfied.

The determination circuit 91 includes a NAND element 101 and an OR element 102, and outputs a low signal when the condition 2 is satisfied.

In the case where the power supply voltage Vcc is higher than the lower limit voltage Vlow and/or the current value of the current flowing through the IGBT 32 is smaller than the current value Ic, in other words, in the case where the IGBT 32 is not likely to be broken by heat, the NAND element 101 outputs a high signal.

When the power supply voltage Vcc is lower than the lower limit voltage Vlow, and the current value of the current flowing through the IGBT 32 is larger than current value Ic, there is a possibility that the IGBT 32 will be broken by heat. In this case, the NAND element 101 outputs a low signal.

Consequently, the NAND element 101 outputs a signal indicative of whether there is a possibility that the IGBT 32 will be broken by heat, based on the results of detections of the power supply voltage Vcc and the current flowing through the IGBT 32.

When the NAND element 101 is outputting a high signal, the OR element 102 outputs a high signal. Specifically, when the NAND element 101 is outputting a high signal, or when the power supply voltage Vcc is lower than the "trip voltage V2", the OR element 102 outputs a high signal.

In contrast, when the NAND element 101 is outputting a low signal and the power supply voltage Vcc is higher than the "trip voltage V2", the OR element 102 outputs a low signal. Consequently, the OR element 102, in other words, the determination circuit 91 outputs a signal for switching an inverter 112 of the output circuit 92 to control charging and discharging of a capacitor 113, which will be described later in detail.

The output circuit 92 is a circuit that, when the condition 2 is satisfied for the predetermined time period T1, in other words, when there is a possibility that the IGBT 32 will be broken by heat, outputs a signal Vdstop for causing the drive circuit 56 to turn off the IGBT 32, in response to the signal from the determination circuit 91. Here, the predetermined time period T1 is shorter than the time period from when the condition 2 has been satisfied and maintained until when the IGBT 32 would be broken by heat.

The output circuit 92 includes a bias current circuit 111, the inverter 112, the capacitor 113, and a comparator 114.

The bias current circuit 111 determines a current passed through a current mirror circuit including a PMOS transistor 124 and a PMOS transistor 125, based on the resistance value of a resistor 123 and the voltage value of a reference voltage VREF3. The bias current circuit 111 includes an operational amplifier 121, an NMOS transistor 122, the resistor 123, and the PMOS transistors 124 and 125. Here, the power supply voltage on the source sides of the PMOS transistors 124 and 125 is a predetermined voltage Vdd.

The operational amplifier 121 has: a non-inverting input terminal to which the reference voltage VREF3 is applied; and an inverting input terminal which is coupled to the source terminal of the NMOS transistor 122 and one end of the resistor 123 for detecting a current I1 flowing through the NMOS transistor 122 and the PMOS transistor 124.

The NMOS transistor 122 is supplied with a current from the diode-connected PMOS transistor 124. The operational amplifier 121 controls the NMOS transistor 122 such that the voltage of the inverting input terminal is equal to the reference voltage VREF3 which is applied to the non-inverting input terminal.

As a result, the current I1 determined by the reference voltage VREF3 and the resistance value of the resistor 123 flows through the diode-connected PMOS transistor 124.

The inverter 112 functions as a switch for switching charging and discharging of the capacitor 113 according to the output of the determination circuit 91. The inverter 112 includes a PMOS transistor 131 and an NMOS transistor 132.

When the inverter 112 receives a low signal from the determination circuit 91, the PMOS transistor 131 of the inverter 112 is turned on. This causes the capacitor 113 to be charged with the current supplied from the bias current circuit 111. When the capacitor 113 is charged, and a voltage Vchg at the non-inverting input terminal of the comparator 114 exceeds a reference voltage VREF4, the comparator 114 sets the signal Vdstop to the high level.

Accordingly, the output circuit 92 sets the signal Vdstop for turning off the IGBT 32 to the high level at the timing delayed by the predetermined time period T1 from the time at which the output circuit 92 receives the low signal from the determination circuit 91. Here, the predetermined time period T1 is determined based on the current value of the current passed by the bias current circuit 111 and the capacitance value of the capacitor 113.

In contrast, when the inverter 112 receives a high signal from the determination circuit 91, the NMOS transistor 132 of the inverter 112 is turned on. As a result, the electric charge stored in the capacitor 113 is discharged to the ground via the NMOS transistor 132. This causes the comparator 114 to set the signal Vdstop to the low level.

Note that the high signal Vdstop for turning off the IGBT 32 corresponds to a "first signal".

<<Overcurrent Protection Circuit 55>>

The overcurrent protection circuit 55 is a circuit that detects whether the current flowing through the IGBT 32 is larger than a current value Iocp which causes overcurrent, based on the voltage Vsu and a predetermined voltage (not illustrated) according to the current value Iocp. Here, the current value Iocp which causes overcurrent corresponds to a "second value" larger than the current value Ic.

<<Drive Circuit 56>>

The drive circuit 56 performs switching of the IGBT 32 in response to the drive signal Vdru from the microcomputer (not illustrated). Specifically, when the drive signal Vdru is high, the drive circuit 56 applies the power supply voltage Vcc to the gate of the IGBT 32 to turn on the IGBT 32, and when the drive signal Vdru is low, the drive circuit 56 applies the ground voltage (0V) to the gate of the IGBT 32 to turn off the IGBT 32.

In addition, the drive circuit 56 is a circuit that turns off the IGBT 32 in response to the high signal Vdstop indicative that the condition 2 has been satisfied for the predetermined time period T1, the high signal Vuvlo indicative of drop in the power supply voltage Vcc, and the signal from the overcurrent protection circuit indicative of overcurrent. Here, the condition 2 is, as described above, that when the power supply voltage Vcc is lower than the lower limit voltage Vlow and higher than the "trip voltage V2", the current value of the current flowing through the IGBT 32 is larger than the current value Ic.

Then, when the drive circuit 56 receives the high signal Vdstop, the drive circuit 56 turns off the IGBT 32. Further, when the power supply voltage Vcc becomes higher than the lower limit voltage Vlow, the drive circuit 56 outputs a signal for switching the IGBT 32.

<<<Motor Phase Current Im>>>

Figure 7:
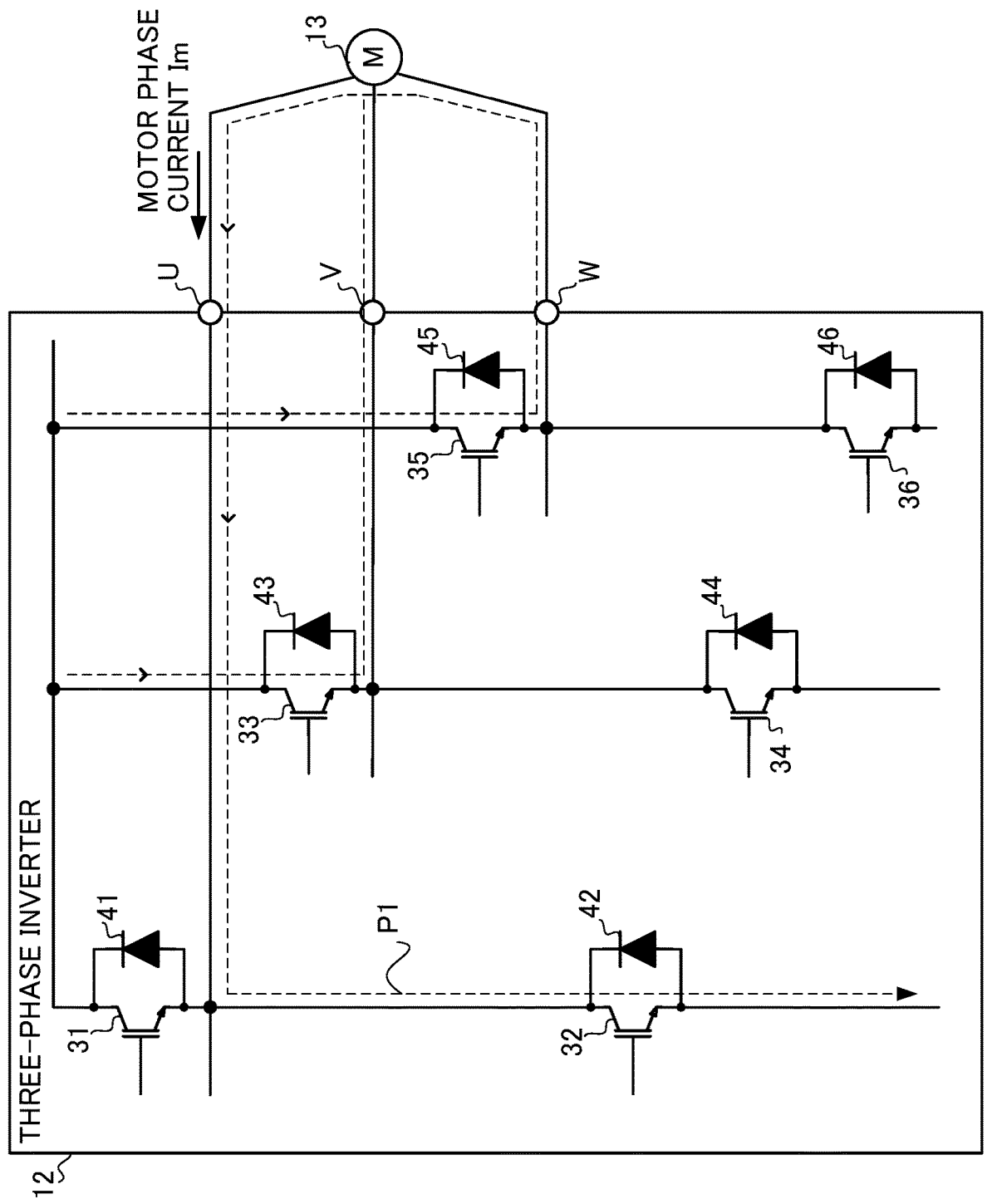
FIG. 7 is a diagram illustrating an example of paths along which a positive motor phase current Im flows in a bridge circuit 30.
Figure 8:
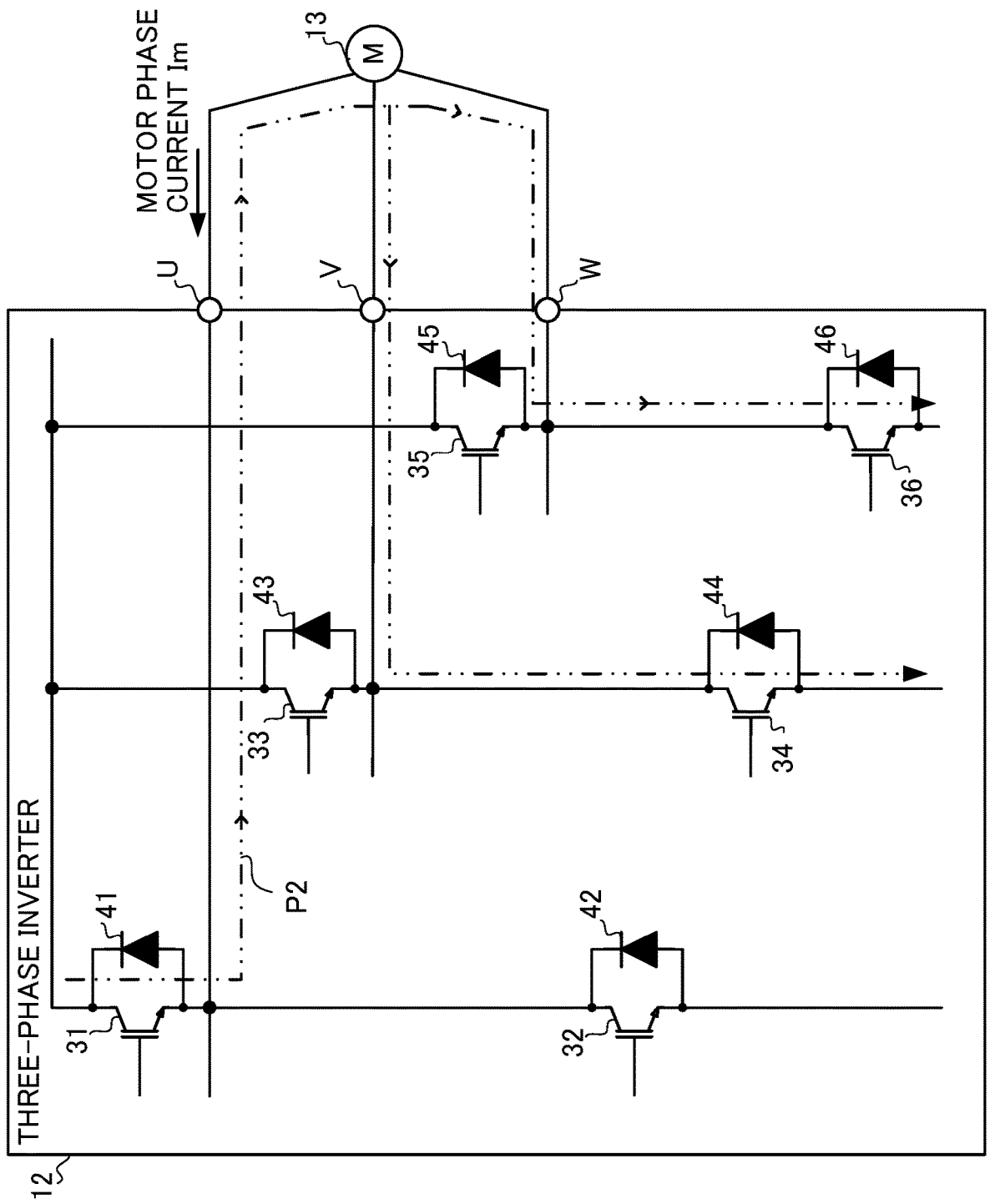
FIG. 8 is a diagram illustrating an example of paths along which a negative motor phase current Im flows in a bridge circuit 30.

FIGS. 7 and 8 are diagrams illustrating examples of the paths of a motor phase current Im that flows in the bridge circuit 30.

First, as illustrated in FIG. 7, it is assumed here that the V-phase IGBT 33 and the W-phase IGBT 35 on the upper arm side and the U-phase IGBT 32 on the lower arm side are ON in the bridge circuit 30. In this case, a current flows from the power supply side to the three-phase motor 13 via the terminals V and W, and then the current flows from the three-phase motor 13 to the ground via the terminal U. Here, when the direction indicated by the arrows in FIG. 7 is defined as positive, the motor phase current Im that flows along the foregoing current path P1 results in being a positive current.

As illustrated in FIG. 8, it is assumed that the U-phase IGBT 31 on the upper arm side and the V-phase IGBT 34 and the W-phase IGBT 36 on the lower arm side are ON in the bridge circuit 30. In this case, a current flows from the power supply side to the three-phase motor 13 via the terminal U, and then the current flows from the three-phase motor 13 to the ground via the terminals V and W. Hence, the motor phase current Im flowing along a current path P2 illustrated in FIG. 8 results in being a negative current.

Note that the foregoing explanation is an example for explaining the relationship between the positive and negative of the motor phase current Im and the current paths P1 and P2 in the bridge circuit 30, and thus other current paths are conceivable.

Figure 9:
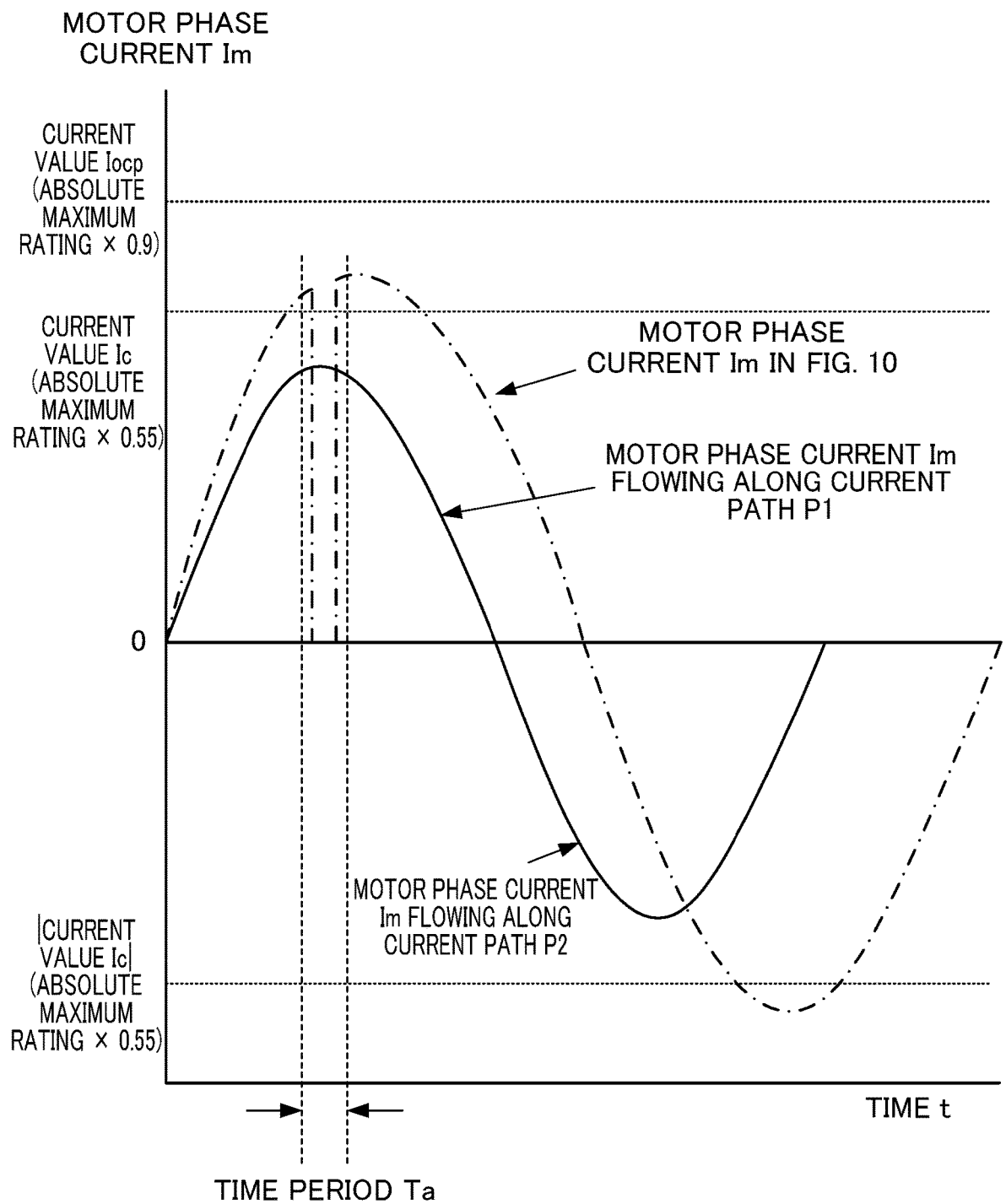
FIG. 9 is a diagram illustrating an example of a change over time in a motor phase current Im.

FIG. 9 is a diagram illustrating an example of a change over time in the motor phase current Im. For example, the current value of the positive motor phase current Im changes according to the ON period of the IGBTs 32, 33, and 35 in FIG. 7 described above. Thus, the ON-time of the IGBTs 31 to 36 of the bridge circuit 30 is controlled to repeat increase and decrease in the motor phase current Im (indicated by the solid line). A time period Ta illustrated in FIG. 9 corresponds to the time period illustrated in FIG. 10 (described later) for explaining the operation of the control circuit 50u.

<<<Operation of Control Circuit 50u>>>

Figure 10:
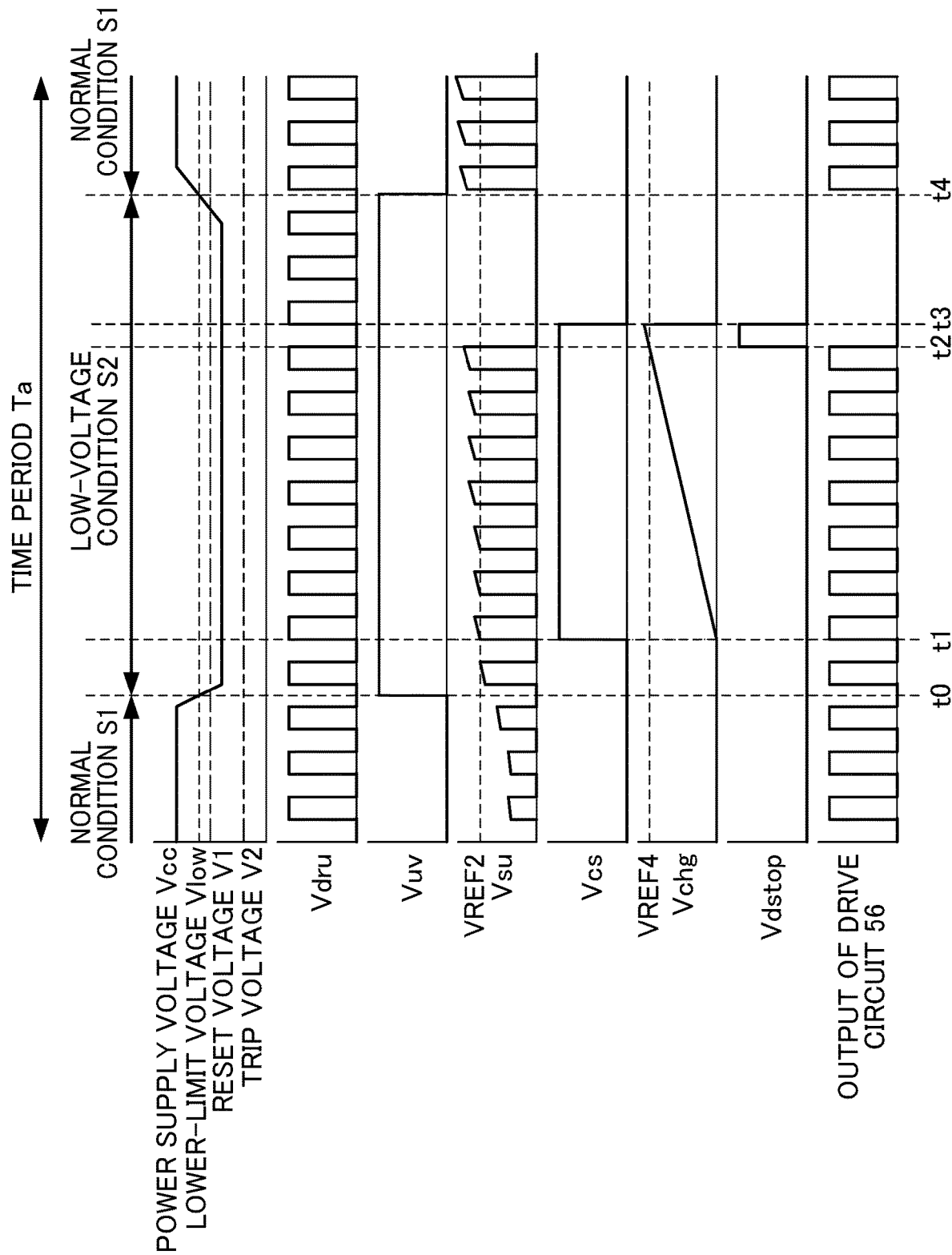
FIG. 10 is a diagram for explaining the operation of a control circuit 50u.

FIG. 10 is a diagram for explaining the operation of the control circuit 50u. FIG. 10 is a diagram obtained by enlarging the time period Ta, in other words, the time period around the timing at which the motor phase current Im (indicated by the dashed dotted line in FIG. 9) having increased with an increase in the torque of the three-phase motor 13 exceeds the current value Ic.

Here, the state where the power supply voltage Vcc of the drive circuit 56 is higher than the lower limit voltage Vlow of the recommended operating range is defined as a normal state S1. In addition, the state where the power supply voltage Vcc is lower than the lower limit voltage Vlow and higher than the trip voltage V2 for activating the low-voltage malfunction prevention circuit 52 is defined as a low-voltage state S2.

Before time t0, the current flowing through the IGBT 32 changes according to change in time (phase) of the motor phase current.

Note that when the power supply voltage Vcc is in the normal state S1 before this time t0, the IGBT 32 is turned on with the power supply voltage Vcc higher than the lower limit voltage Vlow. Hence, the value of the on-voltage of the IGBT 32 is small.

Then, the power supply voltage Vcc generated by the DC/DC converter 20 drops before the time t0, and the power supply voltage Vcc enters, at the time t0, the low-voltage state S2 in which the power supply voltage Vcc is lower than the lower limit voltage Vlow.

When the power supply voltage Vcc enters the low-voltage state S2 at the time t0, the voltage detection circuit 51 sets the signal Vuv to the high level. Further, in the explanation of the operation of the control circuit 50, since the power supply voltage Vcc is higher than the "trip voltage V2", the signal Vuvlo is low.

When the voltage Vsu exceeds the reference voltage VREF2 at time t1, the current detection circuit 53 sets the signal Vcs to the high level. As a result, the condition 2 corresponding to the case in which there is a possibility that the IGBT 32 will be broken by heat is satisfied, and thus the determination circuit 91 of the abnormality detection circuit 54 outputs a low signal, and the PMOS transistor 131 of the inverter 112 is turned on. Then, the capacitor 113 starts being charged with the current from the bias current circuit 111, which causes the voltage Vchg to start increasing.

When the voltage Vchg exceeds the reference voltage VREF4 at time t2, the abnormality detection circuit 54 sets the signal Vdstop to the high level. As a result, the drive circuit 56 stop switching the IGBT 32 to turn off the IGBT 32. When the drive circuit 56 stops switching the IGBT 32, the current flowing through the IGBT 32 is shut off.

At time t3, the voltage Vsu drops below the reference voltage VREF2, and when the drive signal Vdru goes high, the OR element 83 of the current detection circuit 53 resets the SR flip-flop, and the signal Vcs goes low. When the signal Vcs goes low, the determination circuit 91 of the abnormality detection circuit 54 outputs a high signal. Then, the PMOS transistor 131 of the inverter 112 is turned off, and the NMOS transistor 132 is turned on. In association therewith, the capacitor 113 is discharged via the NMOS transistor 132.

At time t4, for example, when the power supply voltage Vcc rises above the lower limit voltage Vlow with recovery of the AC voltage Vac, the drive circuit 56 starts outputting the signal for switching the IGBT 32 again. Accordingly, when the power supply voltage Vcc rises resulting in a situation in which the on-voltage of the IGBT 32 is small and the IGBT 32 is not likely to be broken by heat, switching of the IGBT 32 is resumed. Note that when the determination circuit 91 outputs a low signal again, the output circuit 92 can measure the predetermined time period T1 again.

Here, in the foregoing explanation of the operation, it is assumed that the power supply voltage Vcc does not drop below the "trip voltage V2". In the case where the power supply voltage Vcc drops below the "trip voltage V2", the current detection circuit 53 resets the signal Vcs. Then, the determination circuit 91 of the abnormality detection circuit 54 outputs a high signal, and as a result, the NMOS transistor 132 of the inverter 112 in the output circuit 92 is turned on, so that the capacitor 113 is discharged via the NMOS transistor 132. Then, the abnormality detection circuit 54 is reset. The drive circuit 56 stops switching the IGBT 32.

Modification

An embodiment of the present disclosure indicates an example in which the output circuit 92 is realized as an analog circuit. However, the output circuit 92 is not limited to this, but the output circuit 92 may be realized as a digital circuit such as a timer circuit that measures a time period for which the determination circuit 91 continuously outputs a low signal and sets the signal Vdstop to the high level after an elapse of the predetermined time period T1.

In addition, an embodiment of the present disclosure has been described assuming that the IGBT 32 on the lower arm side of the bridge circuit 30 is a switching device to be controlled by the control circuit 50u. However, the control circuit 50u may control the IGBTs 31, 33, and 35 on the upper arm side of the bridge circuit 30. Use of the control circuit 50u for such a switching device on the upper arm side prevents the switching devices on the upper arm side from being broken by heat.

In addition, in an embodiment of the present disclosure, the control circuit 50u has been described as a circuit that protects the switching device for driving the three-phase motor 13. However, the control circuit 50u is not limited to this. The control circuit 50u may be used for another purpose to protect a switching device against breakage by heat.

Summary

The three-phase inverter 12 according to an embodiment of the present disclosure has been described as above. The control circuit 50u causes the drive circuit 56 to turn off the IGBT 32, only when the condition 2 that a drop in the power supply voltage Vcc of the drive circuit 56 and an increase in the current flowing through the IGBT 32 simultaneously occur is satisfied. This prevents a thermal breakage of the IGBT 32 which can be caused by a rise in the on-voltage of the IGBT 32 and an increase in the current flowing through the IGBT 32.

In the case where the foregoing condition 2 is not satisfied and the low-voltage malfunction prevention circuit 52 or the overcurrent protection circuit 55 is not activated, the IGBT 32 keeps being driven, thereby being able to increase the operating ratio of the system that uses the three-phase motor 13.

In addition, the abnormality detection circuit 54 includes the determination circuit 91 that determines whether the condition 2 is satisfied, and the output circuit 92 that outputs the high signal Vdstop for causing the drive circuit 56 to turn off the IGBT 32 based on the determination result.

In addition, the output circuit 92 outputs the high signal Vdstop when the predetermined time period T1 has elapsed with the condition 2 being satisfied. Accordingly, only when the condition 2 continues for the predetermined time period T1, the IGBT 32 is turned off. This reduces the frequency of restarting the system and increases the operating ratio of the system.

In addition, since the predetermined time period T1 is shorter than the time period from when the condition 2 has been satisfied to when the IGBT 32 would be broken by heat, it is possible to prevent the IGBT 32 from being broken by heat.

In addition, since the lower limit voltage Vlow and the current value Ic can be determined independently, the thresholds to define the condition 2 can be set as appropriate, and this makes it possible to support various needs.

In addition, since the control circuit 50*u* includes the low-voltage malfunction prevention circuit 52, it is possible to stop the system in the case where the power supply voltage Vcc drops excessively.

In addition, since the current detection circuit 53 measure the current flowing through the IGBT 32 while the IGBT 32 is ON, it is possible to accurately detect the possibility of a thermal breakage caused by the on-voltage of the IGBT 32 and the current flowing through the IGBT 32, and turn off the IGBT 32 accordingly.

In addition, since the control circuit 50*u* includes the overcurrent protection circuit 55, it is possible to turn off the IGBT 32 to prevent breakage of the IGBT 32 even if an overcurrent equal to or larger than the current causing thermal breakage flows therethrough. By setting the current value Ic to a value smaller than the current value Iocp detected by the overcurrent protection circuit 55, it is possible to detect a possibility of an occurrence of a breakage (thermal breakage) different from the breakage of the IGBT 32 caused by overcurrent, and distinguish those two types of breakage.

In addition, the control circuit 50*u* can control the IGBT on the lower arm side of the bridge circuit 30.

In addition, the three-phase inverter 12 including the control circuit 50*u* also has the foregoing effects, similarly.

Embodiment(s) of the present disclosure described above is/are simply for facilitating the understanding of the present disclosure and is/are not in any way to be construed as limiting the present disclosure. The present disclosure may variously be changed or altered without departing from its gist and encompass equivalents thereof.

What is claimed is:

1. A control circuit controlling to drive a switching device, comprising:
    a drive circuit receiving a power supply voltage;
    a first detection circuit that detects whether the power supply voltage received by the drive circuit drops below a first level;
    a second detection circuit that receives a current flowing through the switching device and detects whether the current exceeds a first value; and
    an abnormality detection circuit that causes the drive circuit to turn off the switching device when a predetermined period has elapsed since a condition is satisfied, the condition being that both the power supply voltage is lower than the first level and the current flowing through the switching device is larger than the first value, the predetermined period being shorter than an estimated time period from when the condition becomes satisfied to when the switching device would be broken by heat.

2. The control circuit according to claim 1,
    wherein the abnormality detection circuit includes
        a determination circuit that determines whether the condition is satisfied, and
        an output circuit that outputs a first signal to the drive circuit, to thereby cause the drive circuit to turn off the switching device.

3. The control circuit according to claim 1, wherein the first level and the first value are determined independently.

4. The control circuit according to claim 1, further comprising
    an overcurrent protection circuit that causes the drive circuit to turn off the switching device upon detecting that the current flowing through the switching device is larger than a second value that is larger than the first value.

5. The control circuit according to claim 1, wherein the switching device is a device on a lower arm side in a bridge circuit, the bridge circuit including the switching device.

6. A control circuit controlling to drive a switching device, comprising:
    a drive circuit receiving a power supply voltage;
    a first detection circuit that detects whether the power supply voltage received by the drive circuit drops below a first level;
    a second detection circuit that receives a current flowing through the switching device and detects whether the current exceeds a first value;
    an abnormality detection circuit that causes the drive circuit to turn off the switching device responsive to detecting that a condition is satisfied, the condition being that both the power supply voltage is lower than the first level and the current flowing through the switching device is larger than the first value; and
    a low-voltage malfunction prevention circuit that causes the drive circuit to turn off the switching device upon detecting that the power supply voltage drops below a second level that is lower than the first level.

7. The control circuit according to claim 6, wherein
    when the switching device is ON,
        upon detecting that the current flowing through the switching device is larger than the first value, the second detection circuit outputs a second signal indicative that the current flowing through the switching device is larger than the first value, and
        upon detecting that the current flowing through the switching device is smaller than the first value, or that the power supply voltage is lower than the second level, the second detection circuit does not output the second signal.

8. The control circuit according to claim 6,
wherein the abnormality detection circuit includes
a determination circuit that determines whether the condition is satisfied, and
an output circuit that outputs a first signal to the drive circuit, to thereby cause the drive circuit to turn off the switching device.

9. The control circuit according to claim 8, wherein
the output circuit outputs the first signal when a predetermined period has elapsed since the condition becomes satisfied.

10. The control circuit according to claim 9, wherein
the predetermined period is set shorter than an estimated time period from when the condition becomes satisfied to when the switching device would be broken by heat.

11. The control circuit according to claim 6, wherein
the first level and the first value are determined independently.

12. The control circuit according to claim 6, wherein
the switching device is a device on a lower arm side in a bridge circuit, the bridge circuit including the switching device.

13. The control circuit according to claim 6, further comprising
an overcurrent protection circuit that causes the drive circuit to turn off the switching device upon detecting that the current flowing through the switching device is larger than a second value that is larger than the first value.

14. A semiconductor device, comprising:
a switching device;
a drive circuit that receives a power supply voltage and that drives the switching device;
a first detection circuit that detects whether the power supply voltage received by the drive circuit drops below a first level;
a second detection circuit that is connected to the switching device, and that detects whether a current flowing through the switching device exceeds a first value; and
an abnormality detection circuit that causes the drive circuit to turn off the switching device upon detecting that a predetermined period has elapsed since a condition is satisfied, the condition being that the power supply voltage is lower than the first level and the current flowing through the switching device is larger than the first value, the predetermined period being shorter than an estimated time period from when the condition becomes satisfied to when the switching device would be broken by heat.

* * * * *